(12) United States Patent  (10) Patent No.: US 8,956,695 B2
Harumoto et al.  (45) Date of Patent: Feb. 17, 2015

(54) DEVELOPING METHOD

(75) Inventors: Masahiko Harumoto, Kyoto (JP);
Akira Yamaguchi, Kyoto (JP); Akihiro Hisai, Kyoto (JP); Minoru Sugiyama, Kyoto (JP); Takuya Kuroda, Kyoto (JP)

(73) Assignee: SCREEN Semiconductor Solutions Co., Ltd., Kyoto (JP)

( * ) Notice: Subject to any disclaimer, the term of this patent is extended or adjusted under 35 U.S.C. 154(b) by 0 days.

(21) Appl. No.: 13/359,388

(22) Filed: Jan. 26, 2012

(65) Prior Publication Data

US 2012/0122038 A1 May 17, 2012

Related U.S. Application Data

(63) Continuation of application No. 12/252,225, filed on Oct. 15, 2008, now abandoned.

(30) Foreign Application Priority Data

Oct. 18, 2007 (JP) ................... 2007-271366

(51) Int. Cl.
*B05D 3/12* (2006.01)
*G03C 5/29* (2006.01)
*G03F 7/20* (2006.01)
*G03F 7/30* (2006.01)

(52) U.S. Cl.
CPC ............ *G03F 7/2041* (2013.01); *G03F 7/3021* (2013.01)
USPC ............. 427/240; 427/425; 430/434; 118/52; 118/320

(58) Field of Classification Search
CPC ............................ G03F 7/3021; G03F 7/2041
USPC .............. 427/240, 425; 118/52, 320; 430/434
See application file for complete search history.

(56) References Cited

U.S. PATENT DOCUMENTS 4,564,280 A * 1/1986 Fukuda .......................... 396/611
5,935,331 A * 8/1999 Naka et al. .................... 118/319

(Continued)

FOREIGN PATENT DOCUMENTS

EP    1 708 252       10/2004
JP    H09-213616 A1   8/1997

(Continued)

OTHER PUBLICATIONS

Office Action for corresponding Korean Patent Application No. 10-2008-0093034 mailed on Aug. 31, 2010, 7 pages.

(Continued)

*Primary Examiner* — Kirsten Jolley
(74) *Attorney, Agent, or Firm* — Kilpatrick Townsend & Stockton LLP

(57) ABSTRACT

A method for developing a substrate includes spinning the substrate with a spin holder and discharging a developer to the substrate from a plurality of exhaust ports arranged in a row on a developer feeder. The method also includes causing a moving mechanism to move said developer feeder in one direction extending to a center of the substrate in plan view while maintaining a direction of arrangement of said exhaust ports in said one direction, thereby to move said developer feeder between substantially the center and an edge of the substrate. The method further includes causing the developer discharged from said exhaust ports to impinge in separate streams on the substrate, and causing each of the separate streams to impinge spirally on the substrate, thereby to develop the substrate. At least two of loci of positions of impingement of the developer corresponding to said exhaust ports overlap each other.

8 Claims, 9 Drawing Sheets

(56) References Cited

U.S. PATENT DOCUMENTS

| | | | |
|---|---|---|---|
| 5,962,070 | A | 10/1999 | Mitsuhashi et al. |
| 6,371,667 | B1 | 4/2002 | Kitano et al. |
| 6,382,849 | B1 | 5/2002 | Sakamoto et al. |
| 6,383,948 | B1 | 5/2002 | Kitano et al. |
| 6,541,184 | B1 * | 4/2003 | Subramanian et al. ....... 430/311 |
| 6,645,880 | B1 | 11/2003 | Shigemori et al. |
| 8,026,048 | B2 | 9/2011 | Ookouchi et al. |
| 2002/0176936 | A1 | 11/2002 | Matsuyama |
| 2005/0058775 | A1 | 3/2005 | Oku et al. |
| 2006/0040051 | A1 | 2/2006 | Yamamoto et al. |
| 2007/0119479 | A1 | 5/2007 | Yoshihara et al. |
| 2009/0103960 | A1 | 4/2009 | Harumoto et al. |
| 2009/0130614 | A1 | 5/2009 | Ookouchi et al. |

FOREIGN PATENT DOCUMENTS

| | | |
|---|---|---|
| JP | H11-11603 A1 | 4/1999 |
| JP | H11-156278 A1 | 6/1999 |
| JP | 2000-68188 A1 | 3/2000 |
| JP | 2000-311846 A1 | 11/2000 |
| JP | 2001-57334 A1 | 2/2001 |
| JP | 2001-102292 A1 | 4/2001 |
| JP | 2002-353091 A1 | 12/2002 |
| JP | 2004-72061 A1 | 4/2004 |
| JP | 2005-46694 A1 | 5/2005 |
| JP | 2005-210059 | 8/2005 |
| JP | 2005-210059 A1 | 8/2005 |
| JP | 2005-303230 A1 | 10/2005 |
| JP | 2007-150064 A1 | 6/2007 |
| KR | 20-1998-056407 U | 10/1998 |
| KR | 10-0282135 | 3/2001 |
| KR | 10-2006-0053145 A | 5/2006 |
| KR | 10-2007-007262 A | 1/2007 |
| WO | WO 2005/064656 | 7/2005 |

OTHER PUBLICATIONS

Office Action for corresponding Korean Patent Application No. 10-2008-0093034 mailed on Feb. 23, 2011, 4 pages.

Non-Final Office Action for U.S. Appl. No. 12/252,225 mailed on Sep. 27, 2011, 7 pages.

Office Action for corresponding Korean Patent Application No. 10-2011-0074986 mailed on Oct. 14, 2011, 5 pages.

Office Action for corresponding Japanese Application No. 2007-271366 dated Mar. 5, 2013, 3 pages.

Office Action for corresponding Japanese Application No. 2013-206612 dated Jul. 15, 2014, 4 pages. (English translation is not available).

* cited by examiner

▓ range of developer supplied from exhaust port a0
▒ range of developer supplied from exhaust port a1
░ range of developer supplied from exhaust port a2

DEVELOPING METHOD

CROSS-REFERENCES TO RELATED APPLICATIONS

This application is a continuation of U.S. patent application Ser. No. 12/252,225, filed Oct. 15, 2008, which claims priority to Japanese Patent Application 2007-271366, filed Oct. 18, 2007. The disclosures of Ser. No. 12/252,225 and JP 2007-271366 are hereby incorporated by reference in their entirety for all purposes.

BACKGROUND OF THE INVENTION

This invention relates to a developing apparatus for developing semiconductor wafers, glass substrates for liquid crystal displays, glass substrates for photomasks, and substrates for optical disks (hereinafter called simply "substrates"). More particularly, the invention relates to a technique for checking consumption of a developer by supplying the developer to substrates efficiently.

Conventionally, this type of apparatus includes a spin chuck for rotatably supporting a substrate, a slit nozzle for supplying a developer in a belt-like shape to the substrate, and a moving mechanism for moving the slit nozzle. This apparatus supplies the developer in the belt-like shape spirally to the substrate while spinning the substrate and moving the slit nozzle. Compared with the case of forming a puddle of the developer on the substrate to develop the substrate, this apparatus can reduce consumption of the developer (as disclosed in Japanese Unexamined Patent Publication No. 2005-210059, for example).

The conventional apparatus with the above construction has the following drawbacks.

The developer discharged down from the slit nozzle takes the belt-like shape. The belt-like shape of the developer tends to deform with variations in the flow rate of the developer supplied to the slit nozzle. Specifically, the belt-like shape of the developer narrows or splits into two or more strips. In such a case, it becomes difficult to cause the developer to impinge in desired positions or ranges on the substrate. Even though the developer is supplied spirally, there arises an inconvenience that the developer cannot be supplied without gaps over the entire surface of the substrate. In order to avoid such an inconvenience, it is conceivable to supply the developer in an excess quantity. In this case, consumption of the developer is increased.

SUMMARY OF THE INVENTION

This invention has been made having regard to the state of the art noted above, and its object is to provide a developing apparatus that can check consumption of a developer.

The above object is fulfilled, according to embodiments of this invention, by a developing apparatus for developing a substrate, comprising a spin holder for spinnably holding the substrate; a developer feeder having a plurality of exhaust ports arranged in a row for discharging a developer, the developer feeder causing the developer discharged from the exhaust ports to impinge in separate streams on the substrate; a moving mechanism for moving the developer feeder in one direction extending to a center of the substrate in plan view while maintaining a direction of arrangement of the exhaust ports in the one direction, thereby to move the developer feeder between substantially the center and an edge of the substrate in plan view; and a controller for controlling the spin holder and the moving mechanism to cause the separate streams of the developer discharged from the exhaust ports to impinge spirally on the substrate, thereby to develop the substrate.

According to an embodiment of the present invention, the developer discharged from the exhaust ports of the developer feeder remains separate from one another until impingement on the substrate. The developer flows down in a steady shape from the exhaust ports to the surface of the substrate. Therefore, the developer may easily impinge in positions and ranges on the substrate corresponding to the exhaust ports. The developer having impinged on the substrate spreads around the positions of impingement. The moving mechanism, while maintaining the direction of arrangement of exhaust ports in a fixed direction extending toward the center of the substrate in plan view, moves the developer feeder in that same direction between substantially the center and edge of the substrate in plan view.

The controller controls such moving mechanism along with the spin holder to cause the developer from each exhaust port to impinge spirally on the substrate. The ranges where the developer impinges and spreads (i.e. the developer is supplied) on the substrate take the shape of a plurality of spirals corresponding to the respective exhaust ports. At this time, the exhaust ports are constantly on a straight line passing through the center of the substrate in plan view. Consequently, the diameters of the plurality of spiral ranges vary uniformly. It is therefore possible to control easily a positional relationship among the plurality of spiral ranges. Thus, the developer can be supplied efficiently over the entire surface of the substrate, thereby reducing consumption of the developer.

In another aspect of the invention, a developing apparatus for developing a substrate, comprises a spin holder for spinnably holding the substrate; a developer feeder having a plurality of exhaust ports arranged in a row for discharging a developer, the developer feeder causing the developer discharged from the exhaust ports to impinge in separate streams on the substrate; a moving mechanism for moving the developer feeder radially of the substrate between substantially the center and an edge of the substrate, with a direction of arrangement of the exhaust ports extending radially of the substrate; and a controller for controlling the spin holder and the moving mechanism to cause the separate streams of the developer discharged from the exhaust ports to impinge spirally on the substrate, thereby to develop the substrate.

According to this aspect of the invention also, the developer flows down in a steady shape from the exhaust ports of the developer feeder to the surface of the substrate. The developer may easily impinge in positions and ranges on the substrate corresponding to the exhaust ports. The moving mechanism, while maintaining the direction of arrangement of exhaust ports extending radially over the substrate, moves the developer feeder radially over the substrate between substantially the center and edge of the substrate.

The controller controls such moving mechanism along with the spin holder to cause the developer from each exhaust port to impinge spirally on the substrate. The ranges where the developer impinges and spreads (i.e. the developer is supplied) on the substrate take the shape of a plurality of spirals corresponding to the respective exhaust ports. At this time, the exhaust ports are constantly arranged radially of the substrate in plan view. Consequently, the diameters of the plurality of spiral ranges vary uniformly. It is therefore possible to control easily a positional relationship among the plurality of spiral ranges. Thus, the developer can be supplied efficiently over the entire surface of the substrate, thereby reducing consumption of the developer.

In the embodiments of the invention described above, the developer discharged from the exhaust ports may flow down in bar-shaped streams. Since the developer flowing down from the exhaust ports assumes the shape of bars, the developer hardly becomes deformed even with variations in the flow rate of the developer. Therefore, the developer can reliably impinge in the positions and ranges on the substrate corresponding to the exhaust ports.

In the embodiments of the invention described above, the exhaust ports may be arranged close to one another such that, when the developer is discharged simultaneously from the exhaust ports, ranges of the substrate between positions of impingement of the developer are covered by the developer spreading after impingement. The streams of the developer discharged simultaneously from the exhaust ports separately impinge on the substrate. At this time, the developer impinges in a plurality of discrete positions of impingement corresponding to the exhaust ports. The developer having impinged in the positions of impingement spreads out to ranges between the positions of impingement with progress of time. Consequently, the developer can be supplied to one line connecting the positions of impingement without forming gaps. Thus, the developer can be supplied efficiently over the entire surface of the substrate, thereby reducing consumption of the developer.

In the embodiments of the invention described above, the controller may be arranged to control the spin holder and the moving mechanism to cause positions of impingement of adjacent streams of the developer to be close to each other, thereby to cover ranges of the substrate between loci of the positions of impingement with the developer spreading after impingement. By moving the developer feeder while spinning the substrate, the loci of the positions of impingement of the developer are made to extend spirally. The loci of adjacent positions of impingement are formed close to each other, thereby to supply the developer reliably all over the substrate without gaps. The loci of the adjacent positions of impingement may correspond to two different exhaust ports or may correspond to the same exhaust port.

In the embodiments of the invention described above, the controller may be arranged to control the spin holder and the moving mechanism to adjust a relationship between a spinning speed of the substrate and a moving speed of the developer feeder, to thereby control a space between loci of positions of impingement of adjacent streams of the developer. Then, the controller can effectively control the space between the loci of the positions of impingement of adjacent streams of the developer.

In the embodiments of the invention described above, the controller may be arranged to control the space to be a predetermined value or within a predetermined range. The controller can supply the developer properly all over the substrate.

In the embodiments of the invention described above, the controller may be arranged to move, while the substrate makes one revolution, a rearmost one of the exhaust ports, with respect to the direction of movement of the developer feeder, to a position close in the direction of movement to a position of a foremost one of the exhaust ports at start of the one revolution. Then, the controller can supply the developer efficiently over the entire surface of the substrate. This can reduce consumption of the developer.

In the embodiments of the invention described above, the controller may be arranged to cause an overlap between at least two of loci of positions of impingement of the developer corresponding to the exhaust ports overlap each other. Then, the developer can be supplied reliably over the entire surface of the substrate.

In the embodiments of the invention described above, the controller may be arranged to cause overlaps between the loci of positions of impingement of the developer corresponding to the exhaust ports. The developer can be supplied reliably over the entire surface of the substrate.

In the embodiments of the invention described above, the controller may be arranged to move the developer feeder, while the substrate makes one revolution, by a distance having a value corresponding to the distance between centers of an adjacent pair of the exhaust ports divided by a number one less than a total number of the exhaust ports. The developer can be supplied reliably over the entire surface of the substrate.

In the embodiments of the invention described above, the controller may be arranged to move the developer feeder, while the substrate makes one revolution, by a distance shorter than the distance between centers of an adjacent pair of the exhaust ports. The developer can be supplied reliably over the entire surface of the substrate.

In the embodiments of the invention described above, the exhaust ports may be circular and approximately 1 mm in diameter, and an adjacent pair of the exhaust ports may be spaced from each other by approximately 3 mm. Then, the developer flows down from each exhaust port in a cylindrical shape. The shape of the developer will not easily change even with variations in the flow rate of the developer. The developer having impinged in each position of impingement will spread to ranges between the positions of impingement. Thus, the developer can be supplied over the entire surface of the substrate without gaps.

In the embodiments of the invention described above, the controller may be arranged to control the spinning speed of the substrate and the moving speed of the developer feeder to be constant when causing the separate streams of the developer discharged from the exhaust ports to impinge spirally on the substrate, thereby to develop the substrate. Then, the controller can supply the developer effectively all over the substrate.

BRIEF DESCRIPTION OF THE DRAWINGS

For the purpose of illustrating embodiments of the invention, there are shown in the drawings several embodiments, it being understood, however, that the invention is not limited to the precise arrangement and instrumentalities shown.

DETAILED DESCRIPTION OF THE INVENTION

One embodiment of this invention will be described in detail hereinafter with reference to the drawings.

Figure 1:
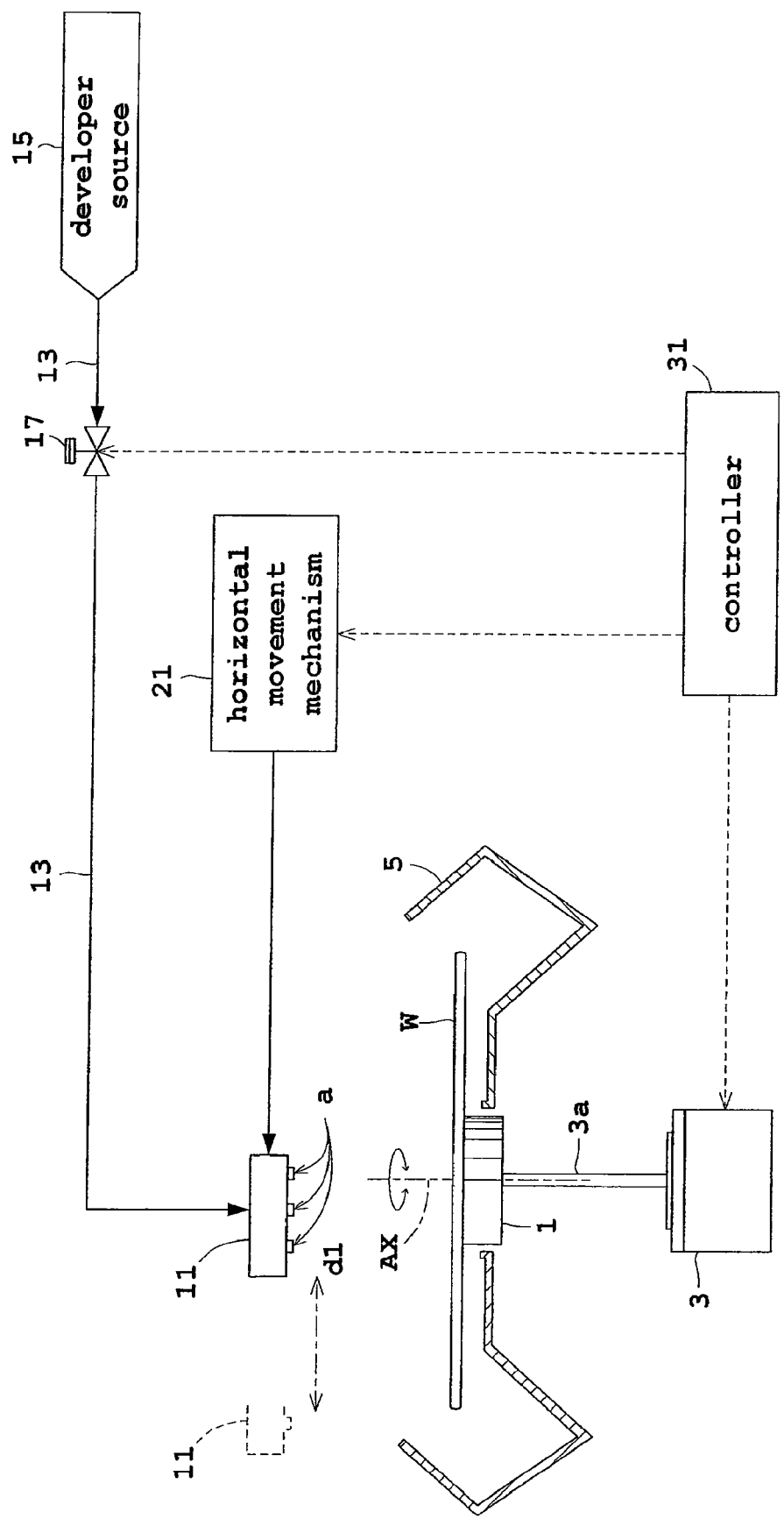
FIG. 1 is a block diagram showing an outline of a developing apparatus according to an embodiment of this invention.
Figure 2:
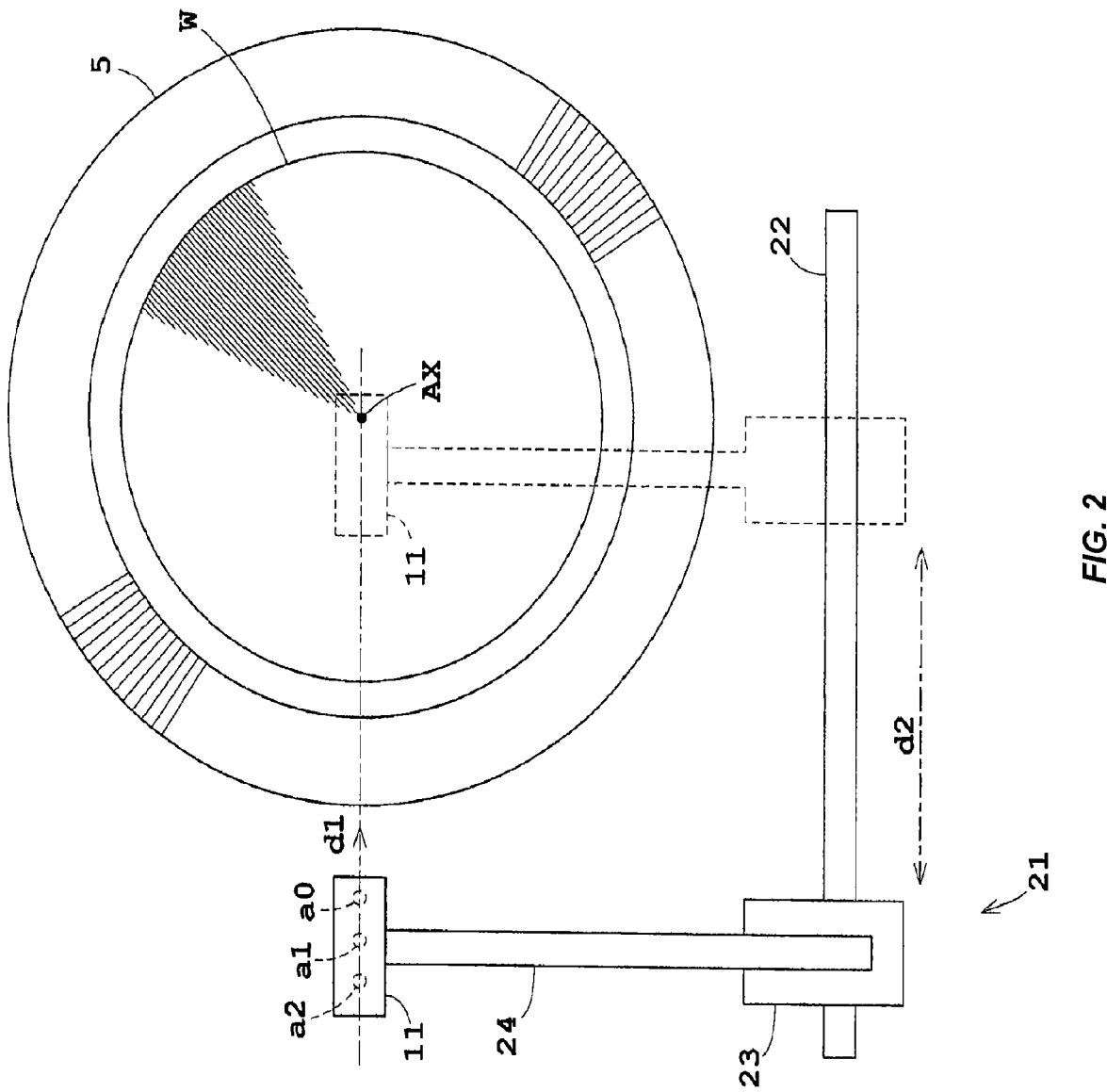
FIG. 2 is a plan view of the developing apparatus.

FIG. 1 is a block diagram showing an outline of a developing apparatus according to this invention. FIG. 2 is a plan view of the developing apparatus.

The developing apparatus in this embodiment includes a spin chuck 1 for supporting a wafer W in horizontal posture by sucking a central part of the lower surface thereof. The spin chuck 1 has a forward end of an output shaft 3a of a motor 3 connected to a lower central position thereof. The motor 3 rotates the output shaft 3a to spin the spin chuck 1 and wafer W about a vertical axis AX. The vertical axis AX extends substantially through the center of the wafer W. The spin chuck 1 and motor 3 correspond to the spin holder in this embodiment. However, the spin holder is not limited to the above example. For example, the spin chuck 1 may be replaced with a spin disk having a plurality of pins for holding edges of wafer W.

The spin chuck 1 is surrounded by a scatter preventive cup 5. The scatter preventive cup 5 has functions to guide downward and collect a developer and other materials scattering from peripheries of the wafer W to the ambient.

The apparatus further includes a developer nozzle 11 for supplying the developer. The developer nozzle 11 has a plurality of (three in this embodiment) exhaust ports "a" arranged in a row on a lower surface thereof. The developer nozzle 11 is connected to one end of developer piping 13. The developer nozzle 11 has flow passages formed therein for communicating the exhaust ports "a" with the developer piping 13 (see FIG. 4A). The other end of developer piping 13 is connected to a developer source 15. The developer piping 13 has a switch valve 17 mounted thereon for opening and closing a developer flow passage. The developer nozzle 11 corresponds to the developer feeder in this embodiment.

The developer nozzle 11 is supported by a horizontal movement mechanism 21. The horizontal movement mechanism 21, while maintaining a direction of arrangement d1 of the exhaust ports "a" extending substantially to the center of wafer W, moves the developer nozzle 11 in that direction. Thus, the horizontal movement mechanism 21 moves the developer nozzle 11 between a position substantially over the center of wafer W (position of the developer nozzle 11 shown in solid lines in FIG. 1), and a position over the edge of wafer W (position of the developer nozzle 11 shown in dotted lines in FIG. 1). Further, the horizontal movement mechanism 21 moves the developer nozzle 11 to a position above and displaced from the wafer W (position of the developer nozzle 11 shown in solid lines in FIG. 2). The position of the developer nozzle 11 shown in dotted lines in FIG. 2 is the position substantially over the center of wafer W.

The horizontal movement mechanism 21 includes a rail 22, a self-propelled deck 23 and an arm 24. The rail 22 has a linear shape, and is installed laterally outward of the scatter preventive cup 5 to extend horizontally. The rail 22 supports the self-propelled deck 23 to be slidable thereon. The self-propelled deck 23 is guided by the rail 22 to move back and forth along a horizontal axis (hereinafter called "moving direction d2") laterally of the scatter preventive cup 5. One end of the arm 24 is connected to an upper part of the self-propelled deck 23, such that the arm 24 is supported in a position above the upper end of the scatter preventive cup 5. The developer nozzle 11 is attached to the other end of the arm 24.

The developing nozzle 11 is supported by the arm 24 to have the direction of arrangement d1 of the exhaust ports "a" pointed substantially to the center of wafer W in plan view. Moreover, the direction of arrangement d1 of the exhaust ports "a" is parallel to the moving direction d2 of the self-propelled table 23. As the self-propelled deck 23 moves back and forth in the moving direction d2, the developing nozzle 11 is moved back and forth relative substantially to the center of wafer W, with the direction of arrangement d1 of the exhaust ports "a" pointed substantially to the center of wafer W in plan view. In other words, the horizontal movement mechanism 21 moves the developing nozzle 11 radially over the wafer W, with the direction of arrangement d1 of the exhaust ports "a" set radially over the wafer W. Consequently, the developer nozzle 11 is movable linearly between the position substantially over the center of wafer W, the position over the edge of wafer W, and the position above and displaced from the wafer W. The horizontal movement mechanism 21 corresponds to the moving mechanism in this embodiment.

Since the moving direction d2 of self-propelled deck 23 is the same as the direction of arrangement d1 of the exhaust ports "a" as described above, reference signs "d1" and "d2" will simply be written "d" as appropriate. Since the moving direction of the developer nozzle 11 coincides with the direction of arrangement d of the exhaust ports "a", the term "moving direction d of the developer nozzle 11" will be used as appropriate. When distinguishing the three exhaust ports "a", they will be referred to as "exhaust ports a0, a1 and a2" in the order of increasing distance from the center of wafer W. The apparatus further includes a rinse nozzle and the like (not shown) arranged movable above the wafer W.

Referring again to FIG. 1, the apparatus includes also a controller 31 for performing overall control of the components described above. Specifically, the controller 31 controls the spinning rate (spinning speed) of the wafer W by driving the motor 3, controls the moving speed of the developer nozzle 11 by driving the horizontal movement mechanism 21, and controls the supply quantity of the developer by opening and closing the switch valve 17.

The controller 31 has treating recipes setting beforehand treating conditions for treating wafers W, and nozzle information concerning the configuration of the developer nozzle 11. The treating conditions include distance L described hereinafter, various treating times such as of development, cleaning and drying, and developer feeding flow rates. The nozzle information includes the size of exhaust ports "a", spacing la between exhaust ports "a" (described hereinafter), and positional relationships between the exhaust ports "a" and wafer W according to positions of the horizontal movement mechanism 21. The controller 31 is realized by a central processing unit (CPU) for performing various processes, a RAM (Random-Access Memory) used as workspace of computations, and a storage medium such as a fixed disk for storing a variety of information.

Next, operation of this developing apparatus will be described. A series of processing steps for developing a wafer W will be described briefly, assuming that the wafer W with resist film formed thereon is already suction-supported by the spin chuck 1.

Step S1

The controller 31 drives the motor 3, opens the switch valve 17, and drives the horizontal movement mechanism 21. Thus, the wafer W is spun, and the developer nozzle 11 is moved in the moving direction d from the position over the edge of wafer W to the position substantially over the center of wafer W while discharging the developer from each exhaust port "a". When the developer nozzle 11 has moved to the position substantially over the center of wafer W, the controller 31 stops the movement of the developer nozzle 11.

Steps S2-S4

The controller 31 causes the developer nozzle 11 to discharge the developer to the wafer W while spinning the wafer W and keeping the developer nozzle 11 still in the position substantially over the center of wafer W. Upon lapse of a predetermined time, the controller 31 stops the discharge of the developer, and moves the developer nozzle 11 to the position above and displaced from the wafer W (step S2). The controller 31 causes the rinse nozzle not shown to supply a rinsing liquid to the wafer W to clean the wafer W. After a predetermined time, the controller 31 stops the supply of the rinsing liquid (step S3). The controller 31 spins the wafer W at high speed to spin-dry the wafer W (step S4). Thus, the wafer W is developed in steps S1 and S2, cleaned in step S3, and dried in step S4.

Next, three processing examples (steps S1a, S1b and S1c) will be described as detailed particulars of the treatment in step S1.

First Processing Example (Step S1a)

While the wafer W makes one revolution, the controller 31 moves the developer nozzle 11 in the moving direction d so that the rearmost exhaust port a2 moves to a position adjacent to the position the foremost exhaust port a0 occupied at the beginning of the revolution.

Figure 3:
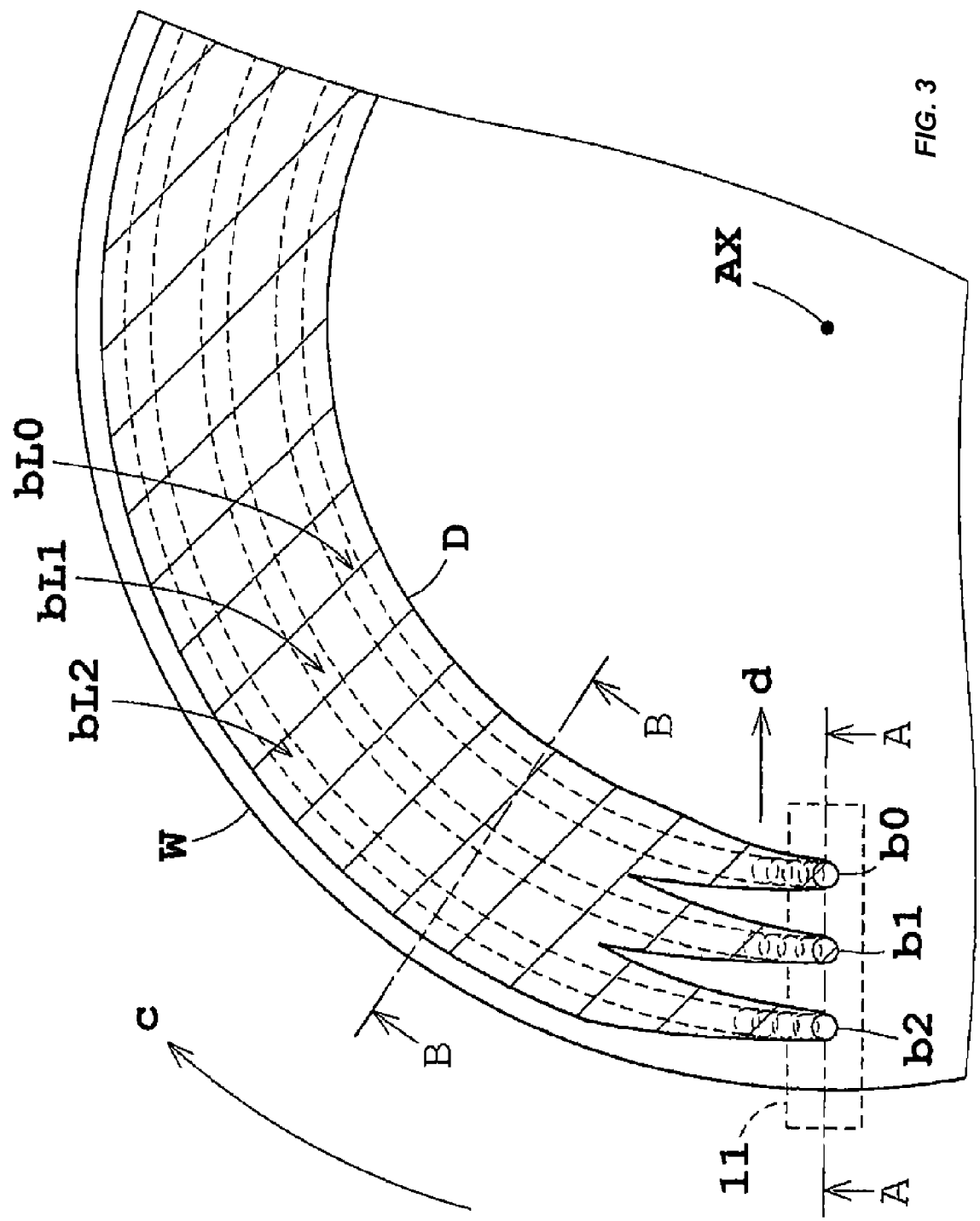
FIG. 3 is a fragmentary plan view schematically showing a state of a developer applied to a substrate.
Figure 4A:
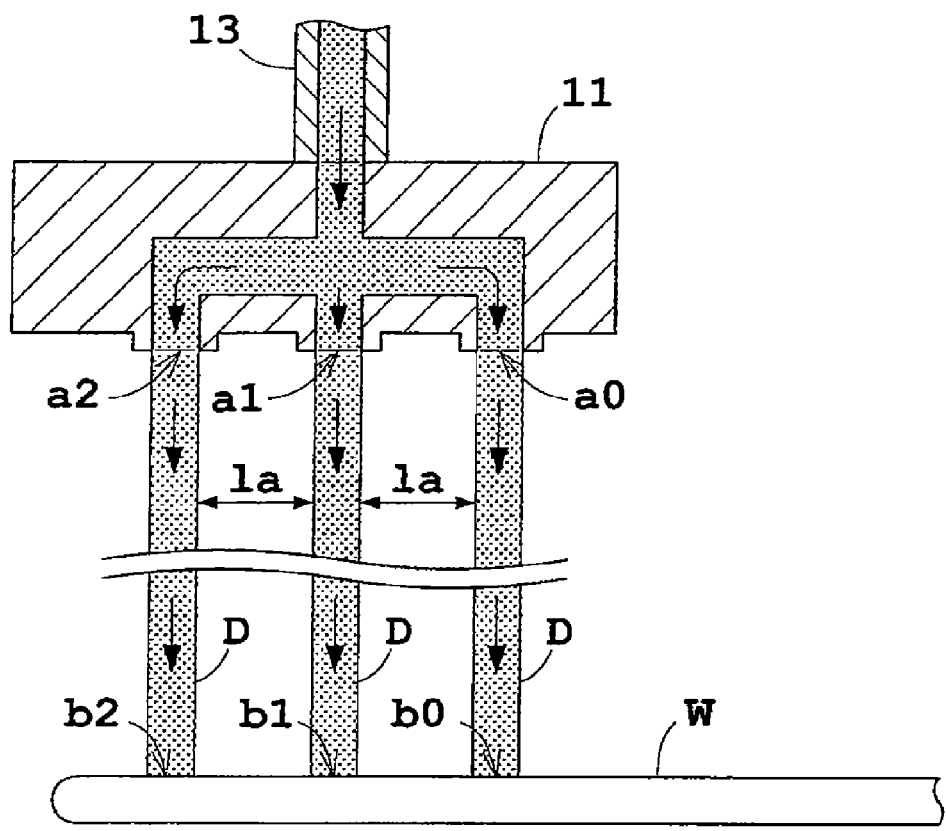
FIG. 4A is a view in vertical section taken on line A-A of FIG. 3.
Figure 4B:
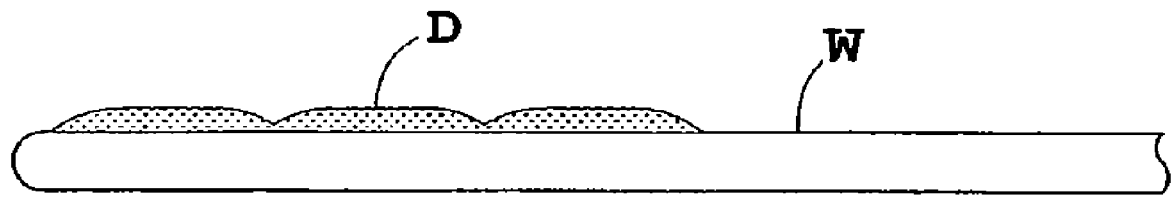
FIG. 4B is a view in vertical section taken on line B-B of FIG. 3.

Reference is made to FIGS. 3, 4A and 4B. FIG. 3 is a fragmentary plan view schematically showing a state of the developer D applied to the wafer W. FIGS. 4A and 4B are views in vertical section taken on lines A-A and B-B of FIG. 3, respectively. As shown in FIG. 4A, the developer D discharged from each exhaust port "a" flows down in the shape of a bar. The streams of the developer D flowing down from the exhaust ports "a" separately impinge on the wafer W (FIG. 4A). Positions where the developer D impinges on the wafer W are substantially directly under the exhaust ports "a" and substantially the same size as the exhaust ports "a". In FIGS. 3, 4A, and 4B, the positions of impingement of the developer D discharged from the exhaust ports a0, a1 and a2 are indicated with signs b0, b1 and b2, respectively. The positions of impingement b0, b1 and b2, when not distinguished from one another, will be referred to simply as "positions of impingement b".

While spinning the wafer W about the vertical axis AX (the spinning direction being indicated with sign "c" in FIG. 3), the developer nozzle 11 is moved in the moving direction d with the developer D discharged from each exhaust port "a". As a result, each position of impingement b shifts continuously. In this specification, areas formed by successions of the positions of impingement b0, b1 and b2 are called loci bL0, bL1 and bL2 of the positions of impingement, respectively. Signs "bL0", "bL1" and "bL2" in FIG. 3 refer to the areas each enclosed by two curved dotted lines corresponding to the position of impingement b0, b1 or b2. The loci bL0, bL1 and bL2 of the positions of impingement, when not distinguished from one another, will be referred to hereinafter simply as "loci bL of the positions of impingement".

The developer D having impinged spreads out from the positions of impingement b with progress of time. The positions of impingement b of the developer D and ranges where the developer D spreads from the positions of impingement b constitute a range where the developer D is supplied to the wafer W. Therefore, as shown in FIG. 3, the range where the developer D is supplied to the wafer W becomes larger than the loci bL of the positions of impingement.

In this embodiment, a space la between the exhaust ports "a" (more particularly, a distance between edges of the exhaust ports "a") is selected and designed as follows based on experimental results, for example. As shown in FIG. 4B, the streams of the developer D discharged simultaneously from the exhaust ports "a" impinge in the positions of impingement b separately from one another. The developer D having impinged spreads out from the positions of impingement b with progress of time, and eventually covers areas between the positions of impingement b. At this time, the developer D having impinged in the discrete positions of impingement b joins on the wafer W. Consequently, as shown in FIG. 3 (particularly adjacent the chain line B-B) and FIG. 4B, the developer D can be supplied to one line connecting the positions of impingement b without forming gaps. In other words, gaps formed at a time of impingement between loci bL0-bL1 of the positions of impingement and between loci bL1-bL2 of the positions of impingement can reliably be supplied with the developer D spreading after the impingement. The space la between the adjacent exhaust ports "a" preferably is 3 (mm), for example. In this case, the exhaust ports "a" are preferably 1 (mm) in diameter.

Figure 5A:
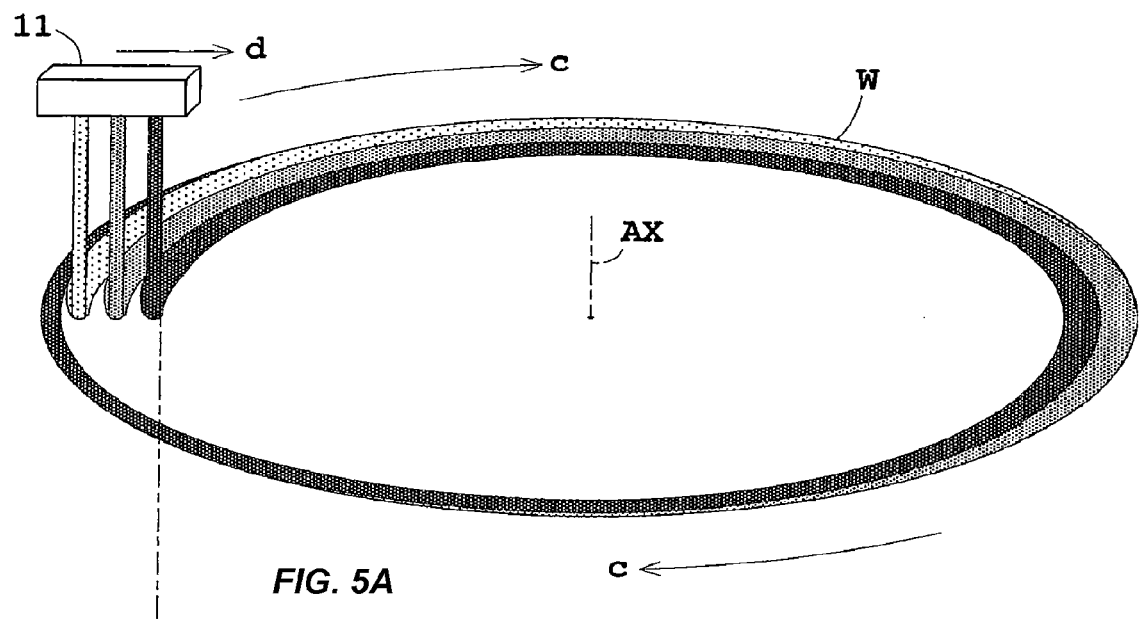
FIG. 5A is a schematic view showing ranges at a certain time of the developer supplied to the surface of the substrate in a first processing example.
Figure 5B:
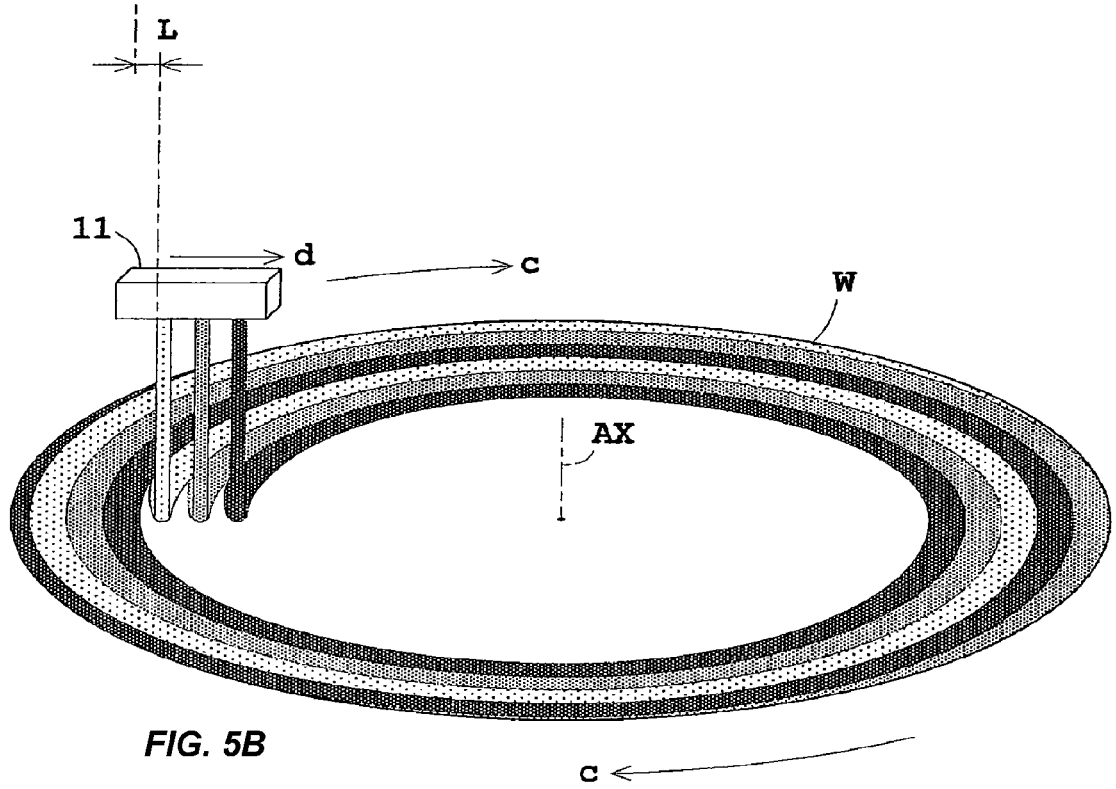
FIG. 5B is a schematic view showing ranges of the developer supplied to the surface of the substrate when the substrate has made one revolution after the time shown in FIG. 5A.

FIG. 5A is a schematic view showing ranges at a certain time of the developer supplied to the surface of wafer W in the first processing example. FIG. 5B is a schematic view showing ranges of the developer supplied to the surface of wafer W when the wafer W has made one revolution after the time shown in FIG. 5A. FIGS. 5A and 5B show, in different pattern densities, the ranges on the wafer W to which the developer has been supplied and which correspond to the exhaust ports a0, a1 and a2. Although signs "a0", "a1" and "a2" are not affixed to the developer nozzle 11 in FIG. 5A or 5B for reasons of illustration, the developer nozzle 11 has exhaust ports a0, a1 and a2 arranged in the order of increasing distance from the center of wafer W.

As shown in FIGS. 5A and 5B, the developer nozzle 11 is moved in the moving direction d while spinning the wafer W about the vertical axis AX (in the direction indicated with sign "c" in FIGS. 5A and 5B). As a result, the developer is supplied to spiral areas with diameters gradually reducing toward the center of wafer W.

Further, as shown in FIGS. 5A and 5B, while the wafer W makes one revolution, the rearmost exhaust port a2 is moved to a position spaced by a distance L in the moving direction d from the position of the foremost exhaust port a0 at start of the spin (hereinafter referred to simply as distance L). As is the space 1a between adjacent exhaust ports "a", the distance L is selected and set to a value not forming gaps on the wafer W where the developer is not supplied. By providing reduced spaces between adjacent loci bL0-bL2 of the positions of impingement of the developer, as shown in FIG. 5B, the range of supply of the developer corresponding to the exhaust port a2 and the range of supply of the developer corresponding to the exhaust port a0 are brought close together.

The above distance L(m) is determined from a relationship between spinning speed ω (rad/s) of the wafer W and moving speed v of the developer nozzle 11 (m/s), and the known nozzle information on the developer nozzle 11 (here, both w and v being positive constants). The distance L(m) will be described hereinafter, using mathematical expressions.

Figure 6:
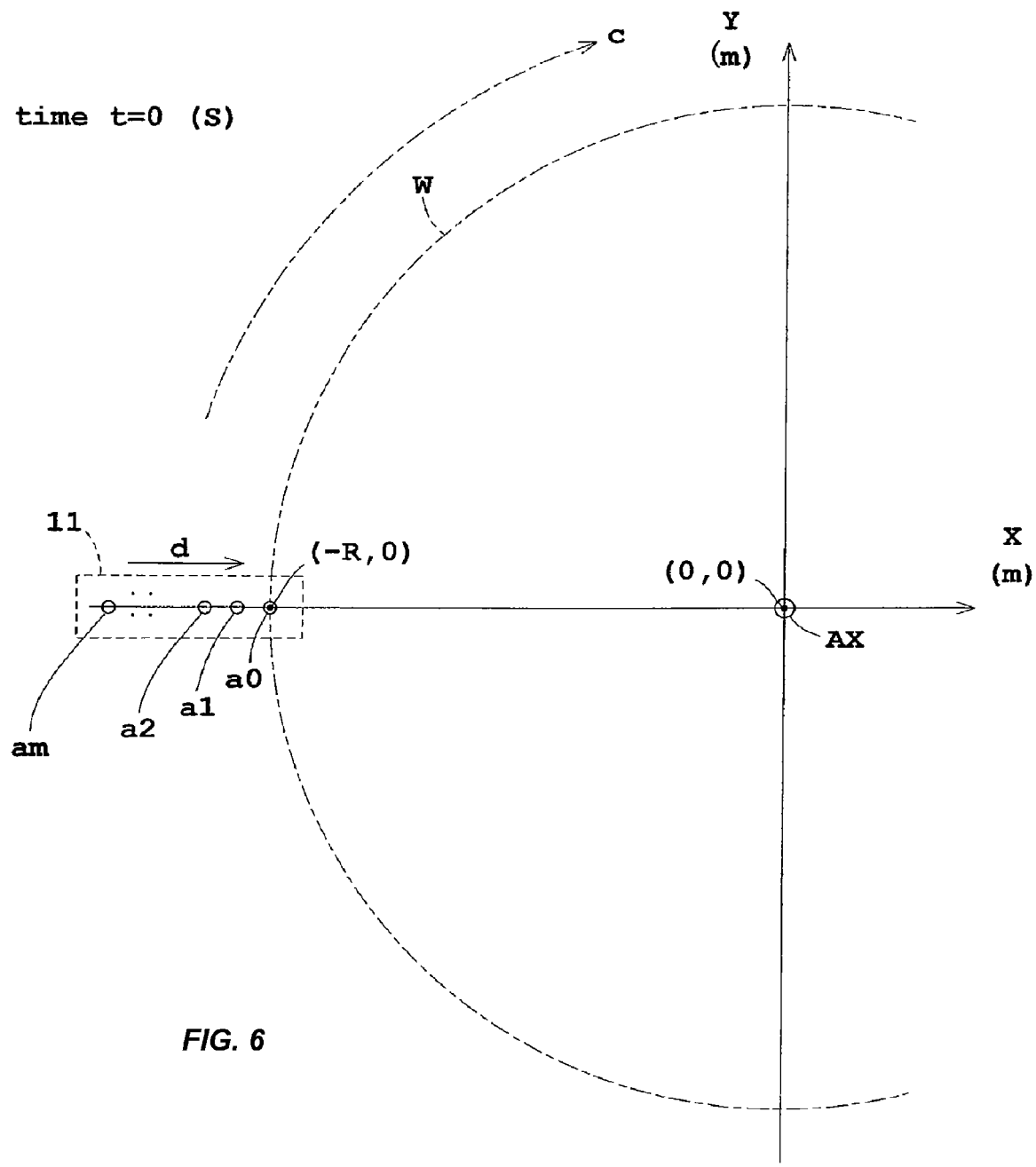
FIG. 6 is a fragmentary plan view schematically showing an orthogonal coordinate system.
Figure 7A:
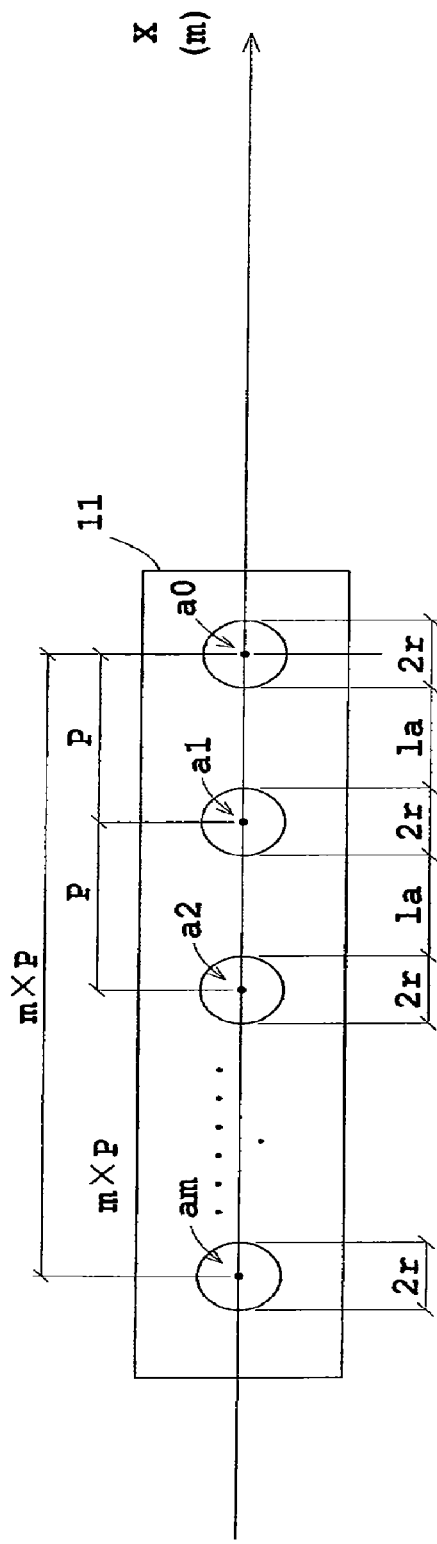
FIG. 7A is a bottom view of a developer nozzle.
Figure 7B:
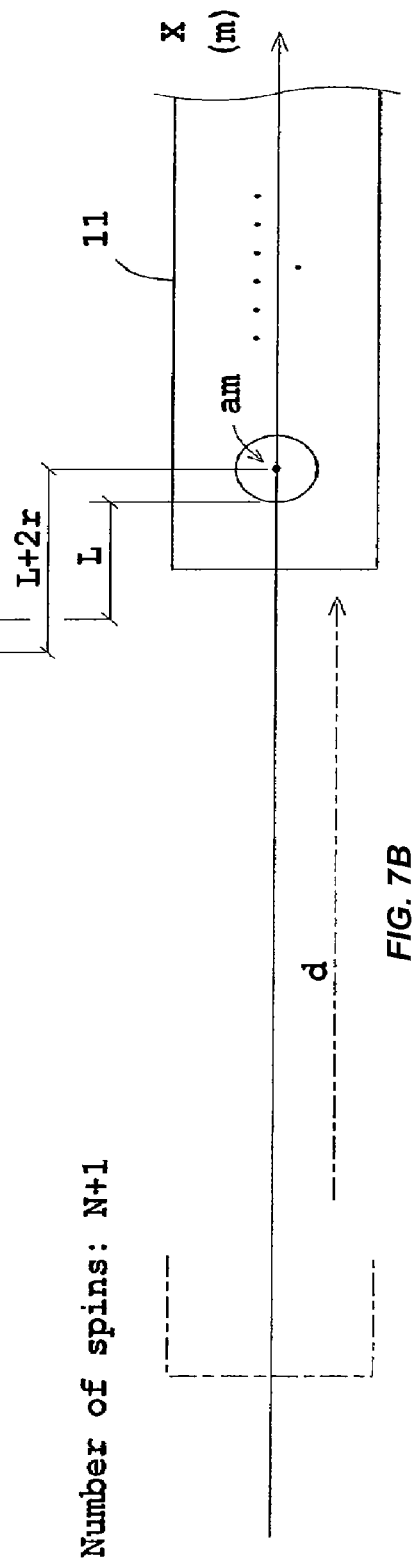
FIG. 7B is a bottom view of the developer nozzle at a time when the substrate has made one revolution after the time shown in FIG. 7A.

FIG. 6 is a plan view schematically showing an orthogonal coordinate system. FIG. 7A is a bottom view of the developer nozzle 11. FIG. 7B is a bottom view of the developer nozzle 11 at a time when the wafer W has made one revolution after the time shown in FIG. 7A. As shown in FIG. 6, the orthogonal coordinate system is assumed on a two-dimensional plane parallel to the surface of wafer W, with an X-axis representing the direction of arrangement d of the exhaust ports "a" (the moving direction d of developer nozzle 11), and a Y-axis extending perpendicular to the X-axis and vertical axis AX. The origin (0, 0) of this orthogonal coordinate system coincides in plan view with the spin center of the wafer W.

The total of exhaust ports "a" formed in developer nozzle 11 is (m+1), which are referred to as exhaust ports a0, a1, a2, ..., am (m being an integer 1 or more) in an order from the foremost one in the moving direction d. As shown in FIGS. 7A and 7B, each exhaust port ai is assumed to be circular with a radius r(m), and a distance between the centers of adjacent exhaust ports "a" to be P(m), (i being any integer from 0 to m, and P being a positive constant). As shown in FIG. 6, when the central position of foremost exhaust port a0 at time t=0(s) is regarded as (−R, 0), the central position of each exhaust port a0 at time t=0(s) is (−R−i×P, 0) (× designating the multiplication symbol and R being a positive constant).

A locus of movement with progress of time t of point Bi (Xi, Yi) on the XY coordinate system, which is a projection of a point on the surface of spinning wafer W directly under the central position of each exhaust port ai, is expressed by the following equations:

$$Xi = (-R - i \times P + v \times t) \times \cos \omega t \quad (1)$$

$$Yi = (-R - i \times P + v \times t) \times \sin \omega t \quad (2)$$

The locus of point Bi may be regarded as the center line of locus bL of the position of impingement noted hereinbefore. Here, angular speed w and moving speed v are constant. Therefore, a space between positions where loci of a plurality of points Bi cross a radial line (in other words, a distance between intersections of loci of a plurality of points Bi and a straight line passing through the origin (0, 0)) is constant in all radial directions. Then, it is expedient to derive the space between the loci of points Bi from positions they pass the negative portion of the X-axis (line segment extending between point (−R, 0) and origin (0, 0)). X coordinates of point Bi on the negative portion of the X-axis are obtained by applying time t=2πN/ω (N being the number of revolutions of the wafer W, which is an integer 0 or more) to the equation (1).

The X coordinate of locus bL of the position of impingement corresponding to exhaust port ai1 when the number of revolutions is $N_1$ is assumed to be $Xi_1$. The X coordinate of locus bL of the position of impingement corresponding to exhaust port $ai_2$ when the number of rotations is $N_2$ is assumed to be $Xi_2$. The difference between the X coordinates ($Xi_1 - Xi_2$) shown in the following equation (3) can be regarded as a distance between the center lines of loci bL of the two positions of impingement.

$$Xi_1 - Xi_2 = (-i_1 + i_2) \times P + v \times 2\pi \times (N_1 - N_2)/\omega \quad (3)$$

The space between the loci bL of the two positions of impingement corresponds to a value of 2r subtracted from the difference between the X coordinates ($Xi_1 - Xi_2$).

When an operation takes place as in Step S1a, assuming that the foremost exhaust port a0 is in position (x, 0) at a given number of rotations N1=n, the rearmost exhaust port am will be in position (x+L+2r, 0) at the number of rotations incremented by one, $N_2 = (n+1)$ (see FIGS. 7A and 7B).

That is, the relations shown in the following equations (4) to (6) are established:

$$i_1 = 0 \quad (4)$$

$$i_2 = m \quad (5)$$

$$N_1 - N_2 = -1 \quad (6)$$

When equations (4) to (6) are applied to equation (3), the following equation (7) is obtained:

$$v \times 2\pi/\omega = L + 2r + m \times P \quad (7)$$

Values of m, P and r in equation (7) are peculiar to the developer nozzle 11 and are all known. Therefore, distance L(m) is automatically derived from the relation between spinning speed w (rad/s) of the wafer W and moving speed v (m/s) of the developer nozzle 11.

Thus, according to the relational expression (7), the number (−m) of exhaust ports "a", distance P between the centers of adjacent exhaust ports "a", and radius r of the exhaust ports "a" are generalized for various developer nozzles 11 having any arbitrary values thereof, thereby being capable of expressing the relation between spinning speed w of the wafer W, moving speed v of the developer nozzle 11 and distance L.

In this embodiment, the controller 31 has the nozzle information specifying the total number (−m) of exhaust ports "a" noted above, and values of the distance P between the centers of adjacent exhaust ports "a" and radius r of the exhaust ports "a". The controller 31 has also a processing recipe prescribing a value (predetermined value) of distance L as a processing condition. In the first processing example, the controller 31 controls the horizontal movement mechanism 21 and motor 3 to maintain the relation between spinning speed w of the wafer W and moving speed v of the developer nozzle 11 derived from equation (7) by applying the predetermined value to distance L. Preferably, the relation between spinning speed w of the wafer W and moving speed v of the developer nozzle 11 is adjusted so that distance L is set to 0.003 (m), for example.

As a result, as shown in FIGS. 5A and 5B, while the wafer W makes one revolution, the rearmost exhaust port am can be moved in the moving direction d to a position close to the position of the foremost exhaust port a0 at start of the spin, leaving a distance L(m) in the moving direction d therebetween. Thus, when the developer nozzle 11 is moved to a position substantially over the center of wafer W, the developer will be supplied all over the wafer W without gaps.

Next, a second processing example (step S1b) of step S1 will be described.

Step S1b

While the wafer W makes one revolution, the controller 31 moves the developer nozzle 11 in the moving direction d by a distance corresponding to distance P between the centers of adjacent exhaust ports "a" divided by a number one less than the total of exhaust ports "a".

Figure 8A:
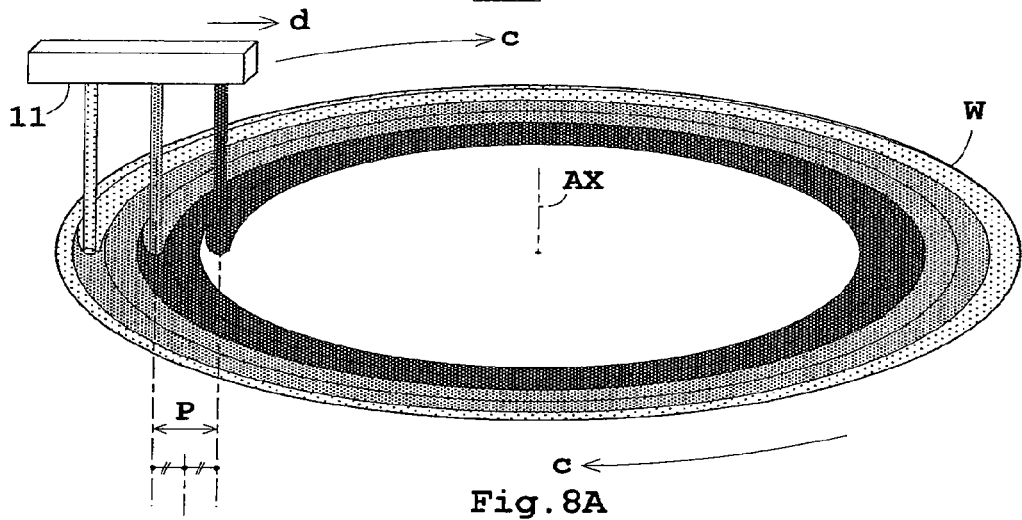
FIG. 8A is a schematic view showing ranges at a certain time of the developer supplied to the surface of the substrate in a second processing example.
Figure 8B:
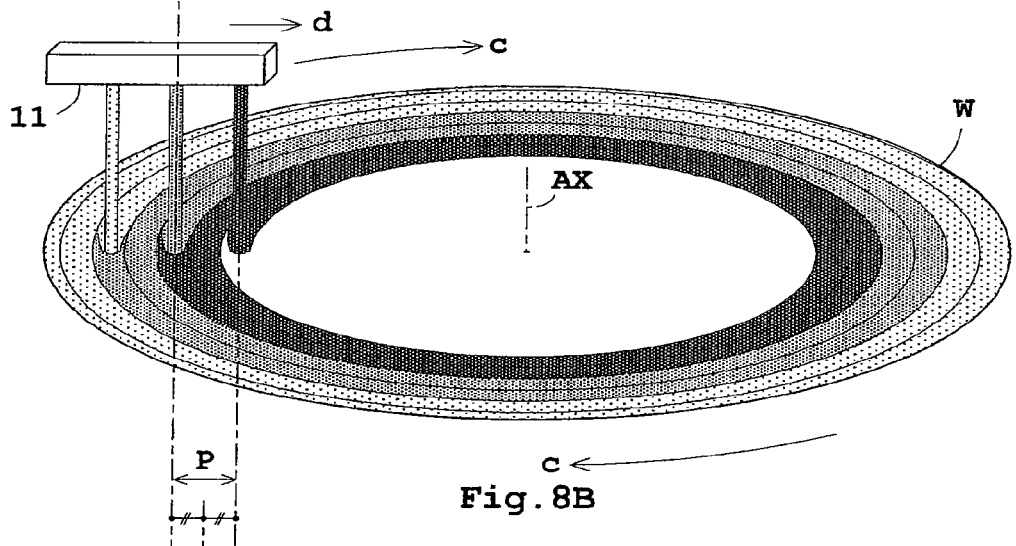
FIG. 8B is a schematic view showing ranges of the developer supplied to the surface of the substrate when the substrate has made one revolution after the time shown in FIG. 8A.
Figure 8C:
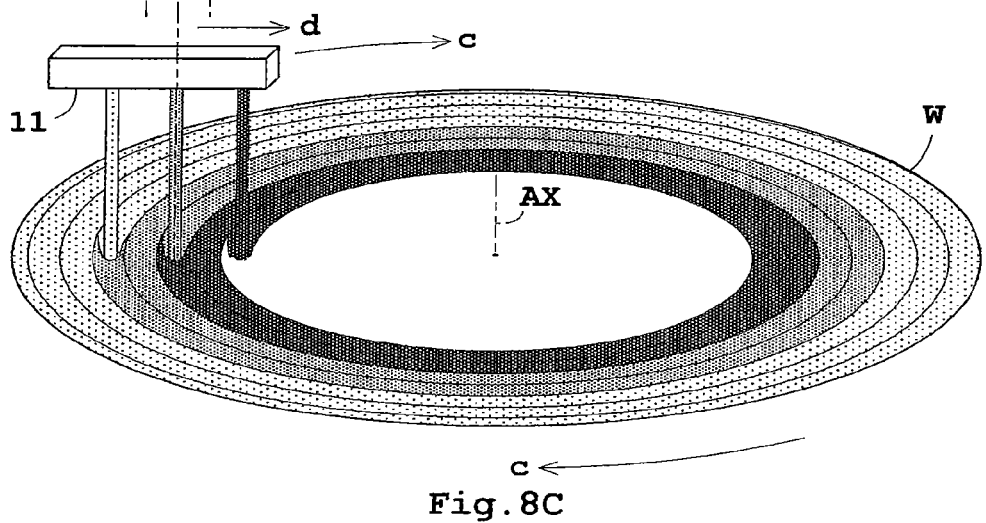
FIG. 8C is a schematic view showing ranges of the developer supplied to the surface of the substrate when the substrate has made two revolutions after the time shown in FIG. 8A.

Reference is made to FIGS. 8A, 8B and 8C. FIG. 8A is a schematic view showing ranges at a certain time of the developer supplied to the surface of the substrate in a second processing example. FIG. 8B is a schematic view showing ranges of the developer supplied to the surface of the substrate when the substrate has made one revolution after the time shown in FIG. 8A. FIG. 8C is a schematic view showing ranges of the developer supplied to the surface of the substrate when the substrate has made two revolutions after the time shown in FIG. 8A. Although signs "a0", "a1" and "a2" are not affixed to the developer nozzle 11 in FIGS. 8A through 8C for reasons of illustration, the developer nozzle 11 has exhaust ports a0, a1 and a2 arranged in the order of increasing distance from the center of wafer W. That is, in this embodiment the developer nozzle 11 has a total of three exhaust ports "a". Thus, while the wafer W makes one revolution, the developer nozzle 11 is moved in the moving direction d by a distance (P/2) corresponding to distance P between the centers of adjacent exhaust ports "a" divided by a number, which is 2, i.e. one less than the total, 3, of the exhaust ports The developing nozzle 11 shown in FIGS. 8A-8C has the exhaust ports "a" arranged with such a large space $1a$ therebetween that a certain type of developer D simultaneously discharged from the exhaust ports "a" cannot cover areas between the plurality of positions of impingement corresponding to the exhaust ports "a". By employing the second processing example for such developer nozzle 11, the ranges failing to be supplied with the developer D simultaneously discharged from the exhaust ports "a" are supplied with the developer D in subsequent revolutions. Thus, the developer can reliably be supplied all over the wafer W.

In the second processing example, the relations shown in the following equations (8) to (10) are established for equation (3):

$$i_1-i_2=-1 \tag{8}$$

$$N_1-N_2=-1 \tag{9}$$

$$Xi_1-Xi_2=(m-1)\times P/m \tag{10}$$

Alternatively, in the second processing example, the relations shown in the following equations (11) to (13) are established for equation (3):

$$i_1-i_2=0 \tag{11}$$

$$N_1-N_2=1 \tag{12}$$

$$Xi_1-Xi_2=-P/m \tag{13}$$

When either equations (8) to (10) or equations (11) to (13) are applied to equation (3), the following equation (14) is obtained.

$$v\times 2\pi/\omega=P/m \tag{14}$$

In the second processing example, the controller 31 controls the horizontal movement mechanism 21 and motor 3 to maintain the relation between spinning speed ω of the wafer W and moving speed v of the developer nozzle 11 derived from equation (14).

Finally, a third processing example (step S1$c$) of step S1 will be described.

Step S1$c$

Controls are carried out so that loci bL of a plurality of positions of impingement corresponding to the exhaust ports ai overlap each other. Then, by moving the developer nozzle 11 to the position substantially over the central position of wafer W, the developer is supplied all over the wafer W without gaps.

Figure 9A:
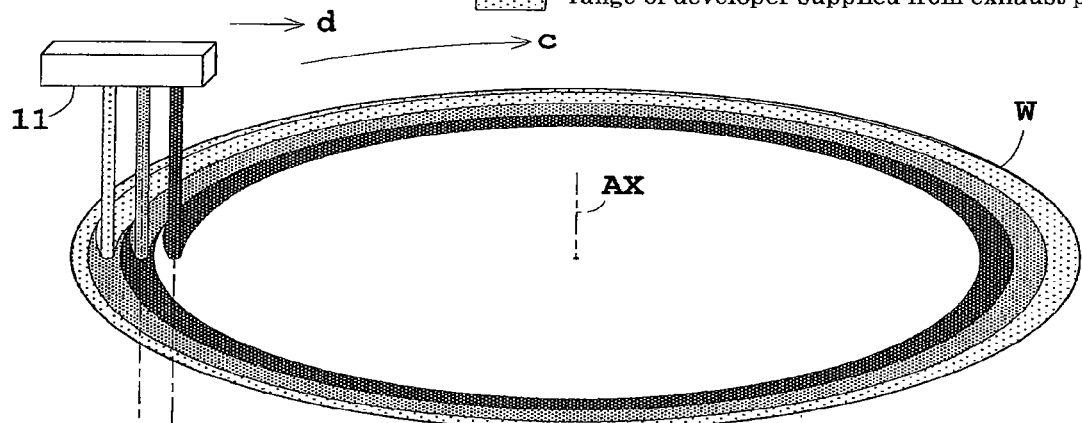
FIG. 9A is a schematic view showing ranges at a certain time of the developer supplied to the surface of the substrate in a third processing example.
Figure 9B:
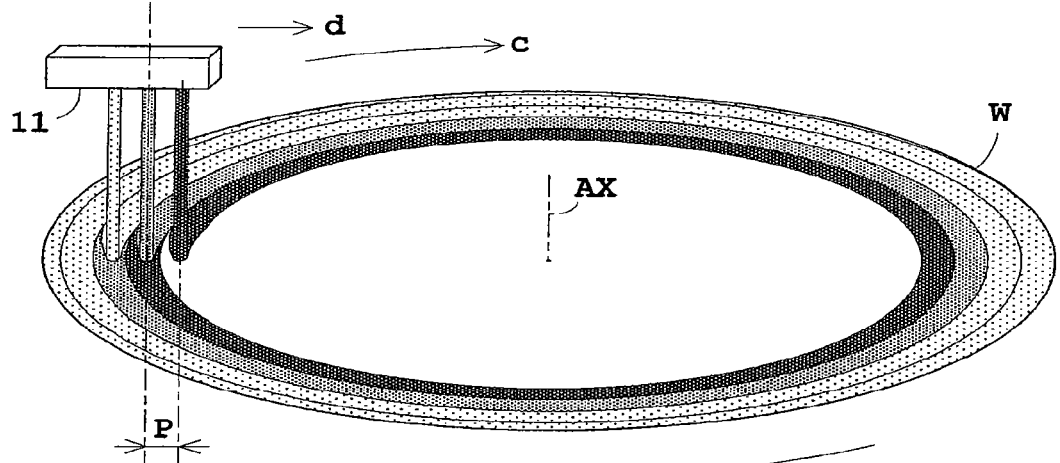
FIG. 9B is a schematic view showing ranges of the developer supplied to the surface of the substrate when the substrate has made one revolution after the time shown in FIG. 9A.
Figure 9C:
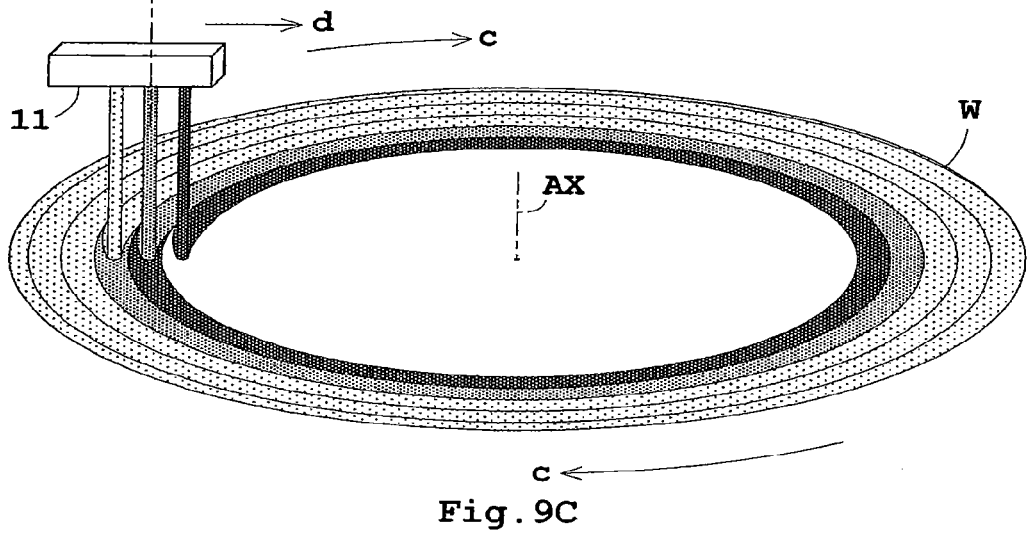
FIG. 9C is a schematic view showing ranges of the developer supplied to the surface of the substrate when the substrate has made two revolutions after the time shown in FIG. 9A.

Reference is made to FIGS. 9A, 9B and 9C. FIG. 9A is a schematic view showing ranges at a certain time of the developer supplied to the surface of the substrate in a second processing example. FIG. 9B is a schematic view showing ranges of the developer supplied to the surface of the substrate when the substrate has made one revolution after the time shown in FIG. 9A. FIG. 9C is a schematic view showing ranges of the developer supplied to the surface of the substrate when the substrate has made two revolutions after the time shown in FIG. 9A. Although signs "a0", "a1" and "a2" are not affixed to the developer nozzle 11 in FIGS. 9A through 9C for reasons of illustration, the developer nozzle 11 has exhaust ports a0, a1 and a2 arranged in the order of increasing distance from the center of wafer W. As shown, loci bL of the two positions of impingement corresponding to two adjacent exhaust ports "a" are in agreement as the wafer W makes one revolution after another. Specifically, locus bL of the position of impingement of exhaust port a0 in the spin shown in FIG. 9A overlaps with locus bL of the position of impingement of exhaust port a1 in the spin shown in FIG. 9B.

In the third processing example, the relations shown in the following equations (15) to (17) are established for equation (3):

$$i_1-i_2=1 \tag{15}$$

$$N_1-N_2=1 \tag{16}$$

$$Xi_1-Xi_2=0 \tag{17}$$

When equations (15) to (17) are applied to equation (3), the following equation (18) is obtained.

$$v\times 2\pi/\omega=P \tag{18}$$

In the third processing example, the controller 31 controls the horizontal movement mechanism 21 and motor 3 to maintain the relation between spinning speed w of the wafer W and moving speed v of the developer nozzle 11 derived from equation (18).

Controls carried out so that loci bL of the plurality of positions of impingement corresponding to adjacent exhaust ports "a" overlap each other may be further generalized to provide controls as follows. Controls may be carried out to overlap at least any two of the loci bL of the plurality of positions of impingement corresponding to the exhaust ports "a".

That is, controls may be carried out so that locus bL of the position of impingement corresponding to exhaust port $ai_1$ and locus bL of the position of impingement corresponding to different exhaust port $ai_2$ are in agreement in different spins.

In such a processing example, the relations shown in the following equations (19) to (21) are established for equation (3):

$$i_1-i_2\neq 0 \tag{19}$$

$$N1-N2\neq 0 \tag{20}$$

$$Xi_1-Xi_2=0 \tag{21}$$

When equations (19) to (21) are applied to equation (3), the following equation (22) is obtained.

$$v\times 2\pi/\omega=(i_1-i_2)\times P/(N_1-N_2) \tag{22}$$

In this case, the controller 31 controls the horizontal movement mechanism 21 and motor 3 to maintain the relation between spinning speed ω of the wafer W and moving speed v of the developer nozzle 11 derived from equation (22).

Thus, according to the developing apparatus in this embodiment, the developer nozzle 11 has a plurality of exhaust ports "a", and the developer discharged from the exhaust ports "a" remains separate from one another until impingement on the wafer W. The developer flows down in a steady shape after discharging from the exhaust ports "a" until impingement on the wafer W. Therefore, the positions and ranges of the developer impinging on the wafer W are also steady, whereby the positions of impingement b of the developer can be controlled and managed easily.

Since each exhaust port "a" is circular, the developer flows down from each exhaust port "a" in a cylindrical shape. The shape of the developer flowing down will not easily change, compared with the developer in a belt-like shape. Specifically, the developer flowing down will not vary in width, or spit into two or more streams.

Further, the exhaust ports "a" are arranged in one row with space la in between. The developer impinging on the wafer W in separate streams from the respective exhaust ports "a" can spread and cover the areas between the positions of impingement b on the wafer W. Thus, the developer can be supplied to the wafer W without gaps.

The horizontal movement mechanism 21, while maintaining the direction of arrangement of exhaust ports "a" in a fixed direction extending toward the center of wafer W in plan view, moves the developer nozzle 11 in that same direction. Thus, the exhaust ports "a" are constantly on a straight line passing through the center of wafer W in plan view. Consequently, the distances from the center of wafer W to the respective exhaust ports "a" uniformly vary in proportion to the distance of movement of the developer nozzle 11. The controller 31 can therefore control positions of loci bL of the positions of impingement by adjusting the relation between the number of revolutions (spinning speed ω) of the wafer W and moving speed v of the developer nozzle 11.

Since the positions of impingement b of the developer corresponding to the respective exhaust ports "a" and the positions of loci bL of the positions of impingement are controllable with high accuracy as noted above, positional relationship between the loci bL of the plurality of positions of impingement can also be adjusted. The developer can be supplied efficiently all over the wafer W without requiring an excess part to be included in the quantity of developer supplied. This realizes a reduction in consumption of the developer.

Specifically, in the first processing example, the loci bL of the positions of impingement corresponding to the exhaust ports "a" do not overlap. The gaps formed between the loci bL of adjacent positions of impingement at the time of impingement are reliably supplied with the developer D spreading after the impingement. In this way, the developer can be supplied very efficiently and uniformly all over the wafer W.

The second processing example is effective where the exhaust ports "a" are arranged with such a large space la therebetween that the developer D discharged simultaneously and in separate streams cannot be supplied to areas between the positions of impingement. That is, according to the second processing example, the ranges between adjacent positions of impingement can be filled with the developer D in subsequent rotations. Thus, the developer can reliably be supplied all over the wafer W.

The third processing example is effective in case the discharge of the developer from the exhaust ports "a" should become unstable. That is, since all the exhaust ports "a" supply the developer D to the same position in different rotations, the developer can reliably be supplied all over the wafer W.

This invention is not limited to the foregoing embodiment, but may be modified as follows:

(1) In the first processing example (step S1a) described above, the preferred values are given as space la and distance L between the exhaust ports "a", but such values are not limitative. The values of space la and distance L between the exhaust ports "a" may be varied as appropriate as long as the ranges between adjacent positions of impingement b can be covered reliably by the developer D spreading after the impingement. The larger these values are, the more efficiently the developer can be supplied, and the greater reduction can be achieved in consumption of the developer.

Thus, the first processing example may be modified to be operable under the following control. That is, the controller 31 has a processing recipe prescribing, rather than the value of distance L, a value of upper limit Lmax of distance L as a processing condition.

Then, the controller 31 may control the motor 3 and horizontal movement mechanism 21 to maintain the distance L at or below the upper limit Lmax (i.e. within a predetermined range), that is to satisfy the following equation (23) transformed from equation (7) noted hereinbefore:

$$L = v \times 2\pi/\omega - 2r - m \times P \leq L\max \quad (23)$$

With the controller 31 performing the control to satisfy equation (23), the number of revolutions of the wafer W made while moving the developer nozzle 11 from the edge of the wafer W substantially to the center thereof may be further reduced, and the entire length of loci bL of the positions of impingement may be shortened. Consequently, the developer can be supplied still more efficiently all over the wafer W.

In addition to the upper limit Lmax of distance L noted above, a lower limit Lmin of distance L may be set beforehand as a processing condition. Then, the controller 31 may control the motor 3 and horizontal movement mechanism 21 to maintain the distance L within a predetermined range from upper limit Lmax to lower limit Lmin, that is to satisfy the following equation (24) transformed from the above equation (7). Based on such control, the first processing example can be carried out effectively.

$$L\min \leq L = v \times 2\pi/\omega - 2r - m \times P \leq L\max \quad (24)$$

(2) In the second processing example (Step S1b) described above, while the wafer W makes one revolution, the developer nozzle 11 is moved in the moving direction d by a distance corresponding to distance P between the centers of adjacent exhaust ports "a" divided by a number one less than the total number of exhaust ports "a". This is not limitative. For example, the distance of moving the developer nozzle 11 in the moving direction d during one revolution of the wafer W may be changed to a distance shorter than the distance P between the centers of adjacent exhaust ports "a".

For example, in addition to the conditional expressions (11) and (12) noted hereinbefore, the following equation (25) may be applied to equation (3):

$$Xi_1 - Xi_2 = -P \times K \quad (25)$$

where k is a coefficient (constant: 0<k<1).

Then, coefficient k or the distance (P×k) shorter than the distance P between the centers of adjacent exhaust ports "a" may be set beforehand as a processing condition. The controller 31 may control the motor 3 and horizontal movement mechanism 21 to satisfy equations (3), (11), (12) and (25).

(3) In the foregoing embodiments, the horizontal movement mechanism 21 moves the developer nozzle 11 horizontally. This is not limitative. As long as the developer nozzle 11 is displaceable between the edge and center of the wafer W in plan view, the movement may include components of other directions.

(4) In each embodiment described above, the moving direction d of developer nozzle 11 has been described as the direction extending substantially to the center of wafer W in plan view. The developer nozzle 11 may supply the developer while moving in the direction opposite to this direction. That is, a change may be made to move the developer nozzle 11 radially substantially from the center of wafer W to the edge of wafer W in plan view.

(5) In the foregoing embodiments, the exhaust ports "a" are circular. As long as the developer discharged flows down in the shape of bars, the shape of exhaust ports "a" can be modified to be rectangular (square) or other shape as appropriate.

(6) In the foregoing embodiments, particularly in the first processing example, the space la between adjacent exhaust ports "a" is indicated preferably as having a value for allowing separate streams of the developer simultaneously having impinged in the discrete positions to join each other on the wafer W. This is not limitative. For example, it is possible to design the space la between adjacent exhaust ports "a" to be so large that separate streams of the developer having simultaneously impinged in the discrete positions and spreading out cannot join each other on the wafer W. Even when the developer nozzle 11 is modified in this way, the developer can be supplied all over the wafer W without gaps by carrying out the second processing example or third processing example.

This invention may be embodied in other specific forms without departing from the spirit or essential attributes thereof and, accordingly, reference should be made to the appended claims, rather than to the foregoing specification, as indicating the scope of the invention.

What is claimed is:

1. A developing method for developing a substrate, comprising:
spinning the substrate with a spin holder;
discharging a developer to the substrate from a plurality of exhaust ports arranged in a row on a developer feeder;
causing a moving mechanism to move said developer feeder in one direction extending to a center of the substrate in plan view while maintaining a direction of arrangement of said exhaust ports in said one direction, thereby to move said developer feeder between substantially the center and an edge of the substrate in plan view; and
causing the developer discharged from said exhaust ports to impinge in separate streams on the substrate at loci of positions of impingement, and causing each of the separate streams to impinge spirally on the substrate, thereby to develop the substrate, wherein the developer discharged from said exhaust ports flows down in bar-shaped streams;
wherein the loci of positions of impingement of the developer corresponding to said exhaust ports overlap each other.

2. The method according to claim 1, wherein said exhaust ports are arranged close to one another such that ranges of the substrate between positions of impingement of the developer are covered by the developer spreading after impingement.

3. The method according to claim 1, wherein said spin holder and said moving mechanism are controlled to cause loci of positions of impingement of adjacent streams of the developer to be close to each other, thereby to cover ranges of the substrate between the loci with the developer spreading after impingement.

4. The method according to claim 1, wherein said spin holder and said moving mechanism are controlled to adjust a relationship between a spinning speed of the substrate and a moving speed of said developer feeder, thereby to control a space between loci of positions of impingement of adjacent streams of the developer.

5. The method according to claim 4, wherein said space is controlled to be a predetermined value or within a predetermined range.

6. The method according to claim 1, wherein said exhaust ports are circular and approximately 1 mm in diameter, and an adjacent pair of said exhaust ports are spaced from each other by approximately 3 mm.

7. The method according to claim 1, wherein a spinning speed of the substrate and a moving speed of said developer feeder are controlled to be constant, respectively, when causing the separate streams of the developer discharged from said exhaust ports to impinge spirally on the substrate.

8. The method according to claim 1, wherein the developer having impinged on the substrate spreads out with progress of time, to cover the ranges of the substrate between the loci.

* * * * *